United States Patent
New (10) Patent No.: US 6,492,922 B1
(45) Date of Patent: Dec. 10, 2002

(54) ANTI-ALIASING FILTER WITH AUTOMATIC CUTOFF FREQUENCY ADAPTATION

(75) Inventor: Bernard J. New, Los Gatos, CA (US)

(73) Assignee: Xilinx Inc., San Jose, CA (US)

( * ) Notice: Subject to any disclaimer, the term of this patent is extended or adjusted under 35 U.S.C. 154(b) by 0 days.

(21) Appl. No.: 09/738,005

(22) Filed: Dec. 14, 2000

(51) Int. Cl.$^7$ .............................. H03M 1/10; H03M 7/00
(52) U.S. Cl. ..................... 341/120; 341/61; 341/155; 341/144
(58) Field of Search ................................ 341/120, 118, 341/117, 119, 61, 155, 144

(56) References Cited

U.S. PATENT DOCUMENTS

| | | | | |
|---|---|---|---|---|
| 5,040,192 A | * | 8/1991 | Tjahjadi ...................... | 375/80 |
| 5,671,252 A | * | 9/1997 | Kovacs et al. ............... | 375/316 |
| 5,784,017 A | * | 7/1998 | Craven ........................ | 341/126 |
| 5,982,228 A | * | 11/1999 | Khorramabadi et al. .... | 324/553 |
| 6,114,902 A | * | 9/2000 | Beatson et al. ............. | 327/553 |
| 6,140,950 A | * | 10/2000 | Oprescu ...................... | 341/143 |
| 6,177,897 B1 | * | 1/2001 | Williams, III ................ | 341/150 |
| 6,208,671 B1 | * | 3/2001 | Paulos et al. .................. | 341/61 |
| 6,268,815 B1 | * | 7/2001 | Gustavsson et al. ......... | 341/143 |
| 6,317,468 B1 | * | 11/2001 | Meyer ......................... | 375/269 |

* cited by examiner

Primary Examiner—Peguy JeanPierre
Assistant Examiner—Jean Bruner JeanGlaude
(74) Attorney, Agent, or Firm—LeRoy D. Maunu; Edel M. Young (57) ABSTRACT

An anti-aliasing filter with adaptable cutoff frequency. In various embodiments, the filter includes a calibrator/adaptor section and an anti-aliasing filter section. Both sections include a cascaded arrangement of adjustable delay circuits, and the calibrator/adaptor section includes a control circuit. A reference signal is input to the delay circuits and the control circuit of the calibrator/adaptor section, and an analog input signal is input to the delay circuits of the anti-aliasing filter. The control circuit compares the directly received reference signal to the reference signal from the last delay circuit and generate an adjustment signal responsive to the comparison. The delay intervals of all the delay circuits are adjustable responsive to the adjustment signal from the control circuit.

30 Claims, 4 Drawing Sheets

ANTI-ALIASING FILTER WITH AUTOMATIC CUTOFF FREQUENCY ADAPTATION

FIELD OF THE INVENTION

The present invention generally relates to low-pass filtering of electrical signals, and more particularly to a low-pass filter having an adjustable cut-off frequency.

BACKGROUND

When an analog signal is sampled, spectral components at frequencies greater than one half the sample rate are overlaid on the components below one half the sample rate. This effect, known as aliasing, can sometimes be exploited as a benefit. However, aliasing is mostly considered detrimental and results in a noisy signal.

Aliasing is typically addressed by interposing a low-pass anti-aliasing filter before the analog-to-digital converter (ADC). If the maximum frequency of interest is $f_{max}$ and the sample rate is $f_s$, the anti-aliasing filter must have a pass band from DC to $f_{max}$, a transition band from $f_{max}$ to $(f_s-f_{max})$, and a stop band above $(f_s-f_{max})$.

Conventional integrated-circuit analog filter design techniques involve building into silicon the components (resistors, capacitors etc.) that define the frequency characteristics of the filter. Thus, once a chip is made, the frequency characteristics of the filter are fixed. This approach limits the range of applications for which a particular device is suitable. For example, if a filter and an ADC are integrated with a field programmable gate array (FPGA) in a device, the pass band, transition band, and stop band are fixed at the time the device is made. However, users will likely desire different frequency bands for different applications. Since all the desired frequency bands are generally unknown at the time the device is made, the device will be suitable for only certain applications.

A circuit arrangement that address the aforementioned problems, as well as other related problems, is therefore desirable.

SUMMARY OF THE INVENTION

An anti-aliasing filter with adaptable cutoff frequency is provided in various embodiments of the invention. In one embodiment, the filter includes a calibrator/adaptor section and an anti-aliasing filter section. Both sections include a cascaded arrangement of adjustable delay circuits, and the calibrator/adaptor section includes a control circuit. A reference signal is input to the delay circuits and the control circuit of the calibrator/adaptor section, and an analog input signal is input to the delay circuits of the anti-aliasing filter. The control circuit compares the directly received reference signal to the reference signal from the last delay circuit and generates an adjustment signal responsive to the comparison. The delay intervals of all the delay circuits are adjustable responsive to the adjustment signal from the control circuit. In another embodiment, the anti-aliasing filter is used in an analog-to-digital conversion (ADC) system having a selectable sample clock rate. When the base sample clock rate is a lower frequency, the input analog signal bypasses the anti-aliasing filter and is input to an ADC circuit, which over-samples and digitizes the signal responsive to a multiplied base sample clock rate. The digital data is then decimated for compliance with the base sample rate. When the base sample clock rate has a higher frequency, the input analog signal is input first to the anti-aliasing filter and then to the ADC circuit. The ADC circuit does not over-sample when operating at the higher frequency, and therefore, no decimation of the data is required.

In another embodiment, the anti-aliasing filter is used in a digital-to-analog conversion (DAC) system having a selectable sample clock rate. When the base sample rate of the system is a lower frequency, digital data are interpolated responsive to a multiplied base sample rate. The interpolated data is thereafter converted to an analog signal by a DAC circuit. When the base sample rate is a higher frequency, the digital input is converted to an analog signal, bypassing the interpolation. The anti-aliasing filter is used to implement a reconstruction filter, which filters the analog signal from the DAC circuit.

Various other embodiments are set forth in the Detailed Description and Claims which follow.

BRIEF DESCRIPTION OF THE DRAWINGS

Various aspects and advantages of the invention will become apparent upon review of the following detailed description and upon reference to the drawings in which.

DETAILED DESCRIPTION

Various embodiments of the present invention are described in terms of analog-to-digital converter (ADC) and digital-to-analog converter (DAC) arrangements. It will be appreciated, however, that the invention is not so limited. Also, those skilled in the art will appreciate that the invention could be adapted to suit the requirements of other filter arrangements implemented in other types of programmable logic devices (PLDS) or ASICs.

Figure 1:
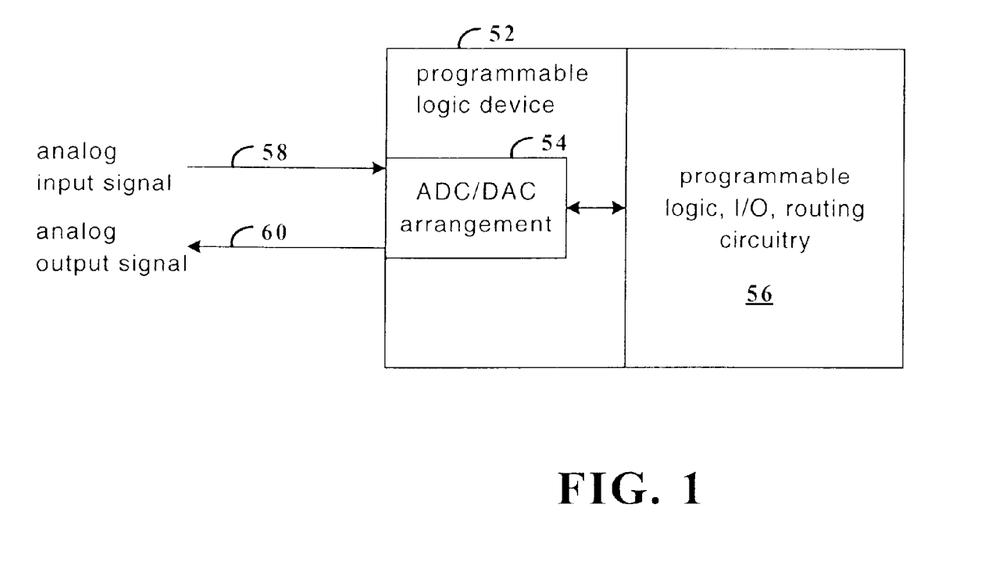
FIG. 1 illustrates a device having an analog ADC/DAC arrangement and programmable circuitry in accordance with one embodiment of the present invention.

FIG. 1 illustrates a device 52 having an analog ADC/DAC arrangement and programmable circuitry in accordance with one embodiment of the present invention. The programmable circuitry includes for example, circuitry used in PLDs. Example PLDs include FPGAS, CPLDS, and PLAS. PLDs are becoming popular in applications such as digital signal processing (DSP), and the advantages of PLDs include programmability in combination with circuit-like speeds.

Conventional DSP arrangements may include various analog circuitry for filtering and conversion between the analog and digital domains in combination with PLDs programmed to process the digital data. Device 52 is a chip that has both analog ADC/DAC circuit arrangements and circuits comprising a conventional PLD. ADC/DAC arrangement 54 comprises circuitry for processing analog signals, and circuitry 56 is programmable for processing digital signals. Combining the analog circuitry with the PLD eliminates the need for separate analog devices and eliminates inefficiencies of low levels of integration. The combined circuitry also eliminates the additional printed circuit board area required for multiple devices.

ADC/DAC arrangement 54 includes various filters, an ADC component, and a DAC component. The ADC receives an analog input signal on line 58, converts the analog signal to digital data, and provides data to circuitry 56 via an input port (not shown). The DAC receives digital data from circuitry 56 via an output port (not shown) and converts the data to an analog signal, which is output on line 60. It will be appreciated that in other embodiments, device 52 could be arranged with only one of the ADC or DAC, depending on specific application requirements.

Circuitry 56 includes programmable resources of device 52. For example, the programmable logic, programmable digital I/O resources, and programmable routing circuitry of a PLD comprise circuitry 56.

A basic anti-aliasing technique is to restrict the maximum frequency of the sampled signal to half the sample rate. Since it is impracticable to build an almost ideal low-pass filter with a sharp cut-off between frequencies that are to be passed and those that are to be rejected, filters are sometimes built such that the sampling rate is some multiple (greater than 2) of the cut-off frequency.

To integrate various filter circuitry with PLD circuitry presents various challenges as described above. For example, different applications will have different sample rates and therefore, different filtering requirements. Since it would be desirable to make device 52 appealing to a wide range of users, it would be desirable to make the analog filter characteristics of the ADC/DAC arrangement adjustable.

Figure 2:
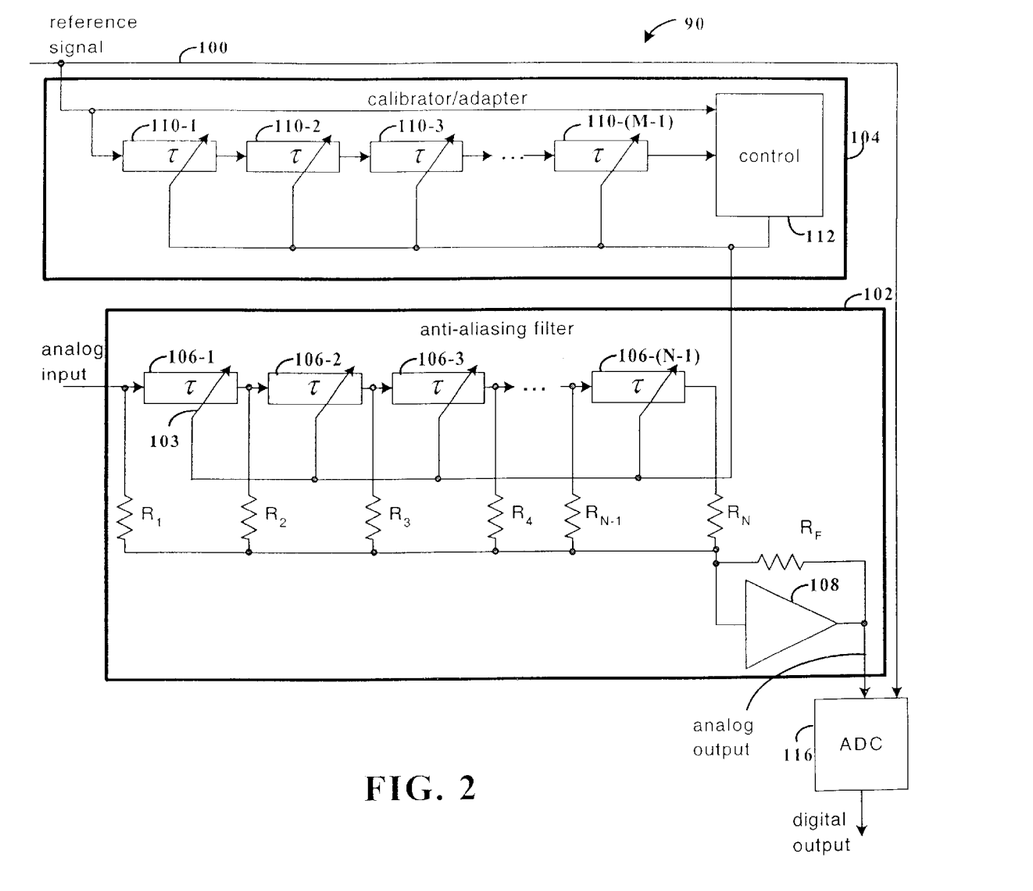
FIG. 2 is a schematic of a filter arrangement having an adaptable cut-off frequency in accordance with one embodiment of the invention.

FIG. 2 is a schematic of a filter arrangement having an adaptable cut-off frequency in accordance with one embodiment of the invention. The example adaptive anti-aliasing filter arrangement 90 has two main components: anti-aliasing filter 102 and calibrator/adapter arrangement 104. In one embodiment, filter 102 is an analog implementation of a Finite Impulse Response (FIR) filter, and calibrator/adapter 104 calibrates and adapts the cut-off frequency of the circuit arrangement based on the period of an input reference signal. Other filter structures such as Infinite Impulse Response (IIR) filters could be used in place of FIR filter 102.

Blocks 106-1 through 106-(N−1) are analog delay lines connected in a cascade arrangement. The delays are adjustable as indicated, for example, by line 103, which is driven by control circuit 112. The outputs of blocks 106-1 through 106-(N−1) are sometimes referred to as "taps". The taps provide access to discrete points in a time history of the signal. The delayed signals are weighted and summed in operational amplifier 108.

The weight of each tap is set by the ratio of the associated resistor to the feedback resistor $R_F$. For example, the weight at the tap of block 106-3 is the ratio of $R_3$ to $R_F$. Thus, the shape of the filter characteristic depends more on the relative accuracy of the resistors than the absolute accuracy. The weights of the taps define the shape of the filter characteristic, and may be selected using known filter synthesis programs.

Whereas, the basic shape of the filter characteristic is defined by the resistors, the absolute value of the cut-off frequency depends on tau, which is the absolute delay of each individual block. More specifically, the cut-off frequency varies in inverse proportion to tau. Since each delay is adjustable (as controlled by control circuit 112 which is responsive to an input reference signal), the cut-off frequency is also adjustable.

Calibrator/adapter 104 is a DLL-like (delay-locked loop) arrangement that includes a cascaded arrangement of taps. A signal having a known period is passed through taps 110-1 through 110-(M−1), and the total delay through the taps is adjustable to one period of the input signal. Control circuit 112 compares the delayed signal with the input signal and continuously adjusts taps 110-1–110-4 such that the total delay is exactly one period of the input signal. Control element 112 can be implemented using known phase comparator arrangements.

Taps 106-1–106-(N−1) of filter 102 are constructed to match taps 110-1–110-(M−1) in calibrator 104. Thus, the delays and the corresponding cut-off frequency are accurately defined by the input signal. Each of taps 106-1–106-(N−1) and 110-1–110-(M−1) can be built with a network operational amplifiers having known delays. The delay of each of the taps can be controlled by selecting which of the amplifiers are used. Alternatively, each of the delay elements could be implemented with a network of transistors having delays that are controllable by the applied voltage level. Other known implementations could also be used for the taps.

If each tap is implemented such that the associated delay can be varied over a relatively wide range, the input reference signal can be used not only to guarantee the accuracy of the cut-off frequency, but also to control the actual cut-off frequency. Since the cut-off frequency varies in inverse proportion to tau and tau is inversely proportional to the frequency of the reference signal, the cut-off frequency varies in proportion to the frequency of the reference signal. In one embodiment, the sample clock used to drive ADC 116 is used to adapt the cut-off frequency of filter 102.

Note that both the analog input and the analog output signals are continuous-time signals, as opposed to discrete time analog sampled signals.

While filter 90 is a continuous-time analog circuit, it displays some characteristics of a digital filter. Because the filter is implemented using non-zero separation between the taps, alias frequencies will be created as if it had a digital sample rate equal to the inverse of tau. Thus tau must be made small enough, and consequently, the effective sample rate high enough that a trivial pre-filter is all that is needed. Filter 90 has the advantage that its effective sample rate can be much higher than an equivalent computationally limited digital filter.

The number of taps, M, in the calibrator/adaptor 102 determines the relationship between tau and the sample rate. The number of taps in the filter, N, is determined by the desired filter characteristic.

For example, if $f_s$ is three times $f_{max}$, the anti-aliasing filter must reject all components above $2f_{max}$ (=$f_s$−$f_{max}$). Achieving this rejection without the invention would require an external filter with a non-trivial rate of roll-off. Instead, the anti-aliasing filter of the invention together with a simple external filter provides the necessary rejection. If M is chosen to be 4, the effective sample rate is $12f_{max}$, and the external pre-filter has from $f_{max}$ to $11f_{max}$ to roll off. This filter would be much simpler.

A desirable characteristic in an anti-aliasing filter is linear phase response. That is, the filter acts like a delay, creating no relative differences in phase between frequency components. The filter affects the relative amplitudes of the frequency components and is achieved by making the weights symmetrical about the center of the delay lines ($R_1=R_N$, $R_2=R_{N-1}$, ...).

Figure 3:
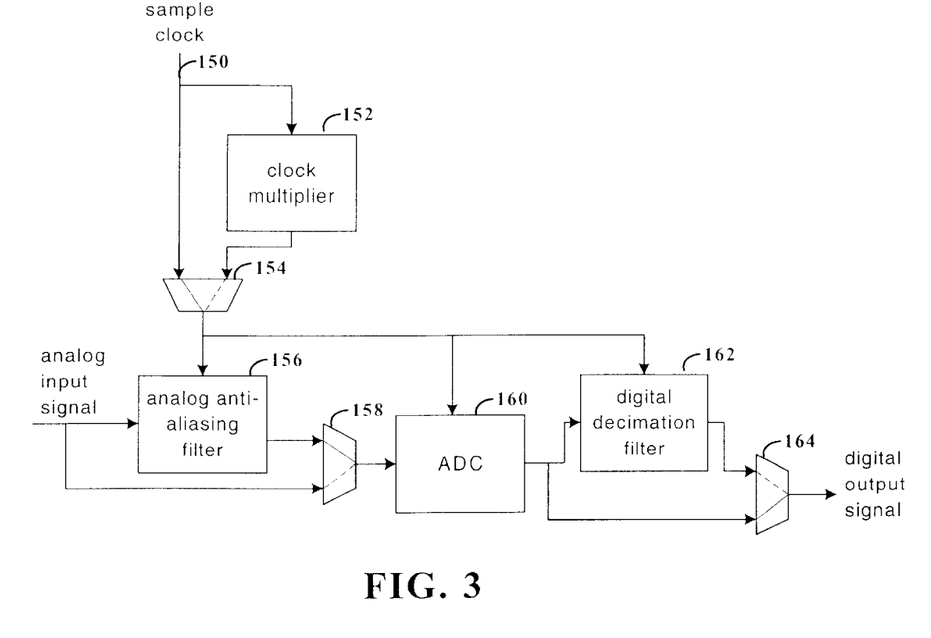
FIG. 3 is a functional block diagram of an ADC system having a digital decimation filter in combination with an adaptive anti-aliasing filter.

FIG. 3 is a functional block diagram of an ADC system having a digital decimation filter in combination with an adaptive anti-aliasing filter. In one embodiment, anti-aliasing filter 156 can be implemented as anti-aliasing filter 90 (described above). The cost of implementing this adaptive anti-aliasing filter increases as the minimum cut-off frequency it can support decreases. This increase is caused by the larger delay lines needed to provide longer delays for lower cut-off frequencies. Economic considerations dictate the minimum frequency at which the anti-aliasing filter 156 can operate.

At frequencies low enough for the ADC to operate at a multiple of the desired sampling rate, an alternative approach is available that may be more cost effective. The data is initially over-sampled, and the sample rate is then reduced to that desired using a digital decimation filter. The over-sample rate is equivalent to the effective sample rate in the analog filter and permits the use of a pre-filter (not shown) for anti-aliasing. The digital decimation filter provides the same filter characteristic as the analog anti-aliasing filter. After filtering, the sample rate may be reduced by simply discarding samples. It will be appreciated, however, that such a system is impracticable at high frequencies since the ADC may not be able to handle the over-sampling rate.

The analog anti-aliasing filter 156 has a minimum cut-off frequency sufficiently low for the over-sampling approach to support any demands for a lower cut-off frequency.

A sample clock input signal is input on line 150 to clock multiplier 152 and selector 154. At lower frequencies, clock multiplier 152 multiplies the sample clock signal to give a higher sample rate. The higher sample rate allows over-sampling of the input. At higher frequencies the sample clock signal on line 150 is selected, and at lower frequencies, selector 154 selects the output from clock multiplier 152.

The analog input signal is input to both anti-aliasing filter 156 and to selector 158. At higher frequencies, selector 158 provides the output of the anti-aliasing filter to ADC 160 for sampling at the rate of the sample clock. At lower frequencies, the selector provides the input analog signal directly to the ADC where it is over-sampled (in response to the multiplied sample clock signal).

The output signal from selector 158 is input to ADC 160, which can be implemented using conventional circuitry. The digital output from ADC 160 is input to both digital decimation filter 162 and to selector 164. At higher frequencies the output signal from ADC 160 is selected, and at lower frequencies (where the sample clock was multiplied), selector 164 selects the output signal from decimation filter 162. Decimation filter 162 low-pass filters the signal and selectively discards samples. For example, if the clock rate is multiplied by 4, then decimation filter may remove every second, third, and fourth sample, thereby restoring the stream of digital samples to the original sample clock rate.

In one embodiment, selectors 154, 158, and 164 are controlled by a single configuration bit stored in the PLD. This bit allows the user to choose at design time which path is appropriate for the application. When the bit is set to support a high sample clock frequency, selectors 154, 158, and 164 implement the paths indicated by solid lines. When the bit supports a low sample clock frequency, paths indicated by the dashed lines are implemented.

In other embodiments, control of selectors 154, 158, and 164 allows additional options. For example, selectors 158 and 164 may be controlled to select both of analog anti-aliasing filter 156 and digital decimation filter 162 regardless of whether selector 154 selects clock multiplier 152.

Figure 4:
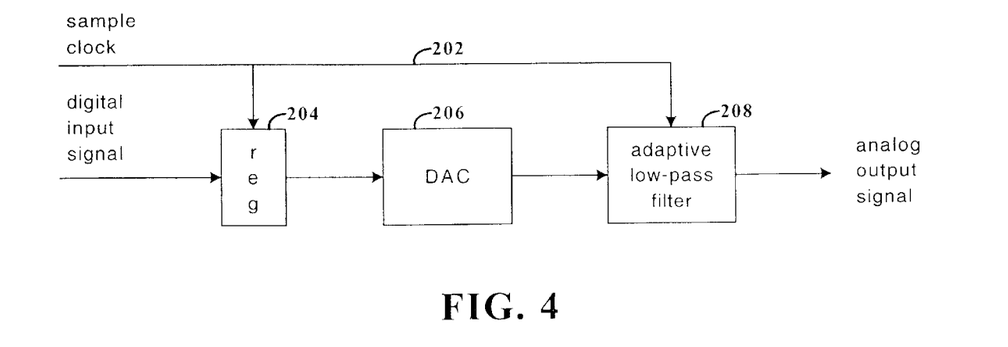
FIG. 4 is a functional block diagram of a reconstruction system in accordance with one embodiment of the invention.

FIG. 4 is a functional block diagram of a reconstruction system in accordance with one embodiment of the invention. It will be appreciated that the filter characteristic required to reconstruct an analog signal from a set of samples is identical to the filter used for anti-aliasing. Thus, the same adaptive anti-aliasing filter arrangement described in conjunction with FIG. 2 can also be used as a reconstruction filter.

The sample rate used to reconstruct an analog signal from the digital data is controlled by a sample clock signal that is input on line 202. The digital data from which the analog signal is generated is input to register 204, which is clocked by the sample clock. DAC 206 reads data values from register 204 and converts the data into an analog signal that is fed into adaptive low-pass filter arrangement 208. Filter arrangement 208, which is implemented in accordance with the teachings of FIG. 2, removes undesirable components from the analog signal and is adaptable to a range of sample rates. As in the input case, a trivial analog post filter may be required.

Analogous to the above described techniques for extending an ADC system to operate at lower sample rates using over-sampling, the DAC system can also be adapted to operate at lower sample rates.

Figure 5:
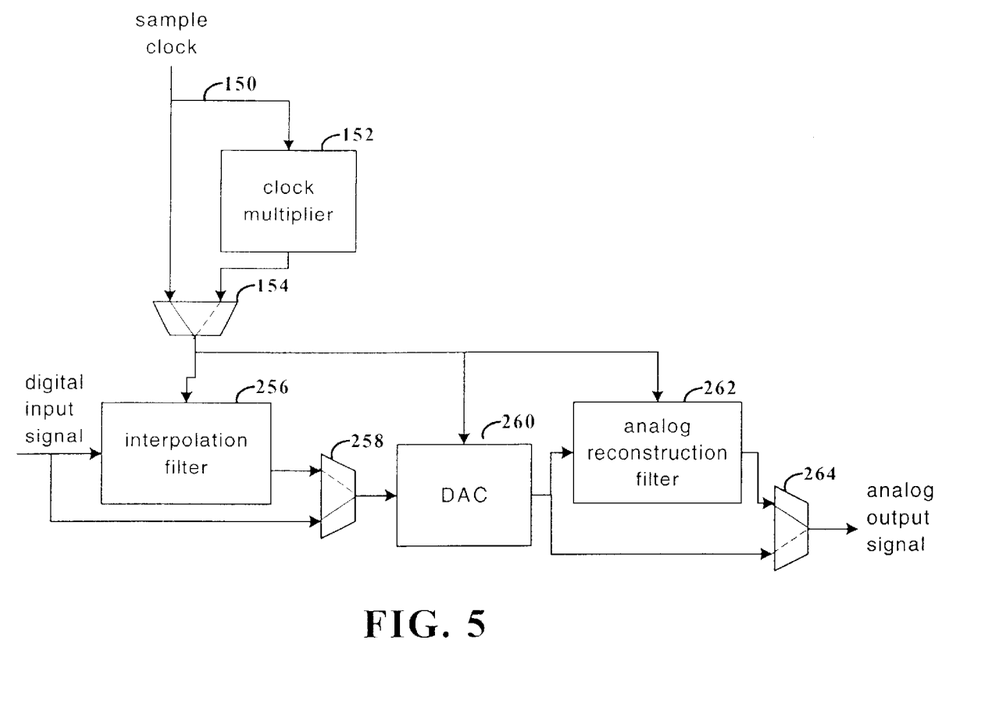
FIG. 5 is a functional block diagram of a reconstruction system having a digital interpolation filter in combination with an adaptive anti-aliasing filter.

FIG. 5 is a functional block diagram of a DAC system having a digital interpolation filter in combination with an adaptive reconstruction filter. As described in conjunction with the anti-aliasing example, it is uneconomic to use the adaptive filter at low frequencies. However, a digital interpolation provides an equivalent benefit to that of the digital decimation filter. The sample rate provided to the DAC is increased by adding additional samples between the existing samples. Consequently, only a trivial external reconstruction filter is required.

A sample clock input signal is input on line 150 to clock multiplier 152 and selector 154. At lower frequencies, clock multiplier 152 multiplies the sample clock signal to give a higher speed clock. The interpolation filter provides samples that match this faster clock. At lower sample clock frequencies, selector 154 selects the output from clock multiplier 152, and at higher sample clock frequencies the sample clock signal on line 150 is selected.

Digital data are input to both digital interpolation filter 256 and selector 258. The output signal from selector 258 is input to DAC 260, which can be implemented using conventional circuitry. The digital output from DAC 260 is input to both analog reconstruction filter 262 and to selector 264. At lower sample clock frequencies (where the sample clock is multiplied), selector 258 selects the output signal from interpolation filter 256, and at higher frequencies the directly input digital data is selected. Interpolation filter 256 selectively interpolates data values. For example, if the clock rate is multiplied by 4, then interpolation filter 256 may interpolate second, third, and fourth data values for each input value in order to provide digital data values equal in number to the multiplied sample clock rate.

The data selected by selector 258 are input to DAC 260, which converts the digital data to an analog signal. It will be appreciated that DAC 260 includes buffers (not shown) that are suitable for storing the digital data.

The analog signal is input to both reconstruction filter 262 and to selector 264. At lower sample clock frequencies, the direct path is selected, and at higher sample clock frequencies the data from the analog reconstruction filter is selected. In both cases, a trivial post filter may be required.

As in the anti-aliasing filter, a single configuration bit set by the user at design time may control selectors 154, 258, and 264 to route data through the appropriate path. Alternatively, more than one bit may control selectors 154, 258, and 264 so that more modes of operation are available. For example, both of interpolation filter 256 and analog reconstruction filter 262 may be used at the same time.

The present invention is believed to be suitable for a variety of device types and has been found to be particularly suited for implementation on an FPGA. Other aspects and embodiments of the present invention will be apparent to those skilled in the art from consideration of the specification and practice of the invention disclosed herein. For example, while the above description refers to low pass anti-aliasing filters, the invention can also be used with band pass anti-aliasing filters having both low and high cut-off frequencies. In other applications, the filter of the invention can be used as a low pass filter, band pass filter, or a high pass filter. It is intended that the specification and illustrated embodiments be considered as examples only, with a true scope and spirit of the invention being indicated by the following claims.

What is claimed:

1. An adaptive anti-aliasing filter arrangement for filtering an analog input signal with filter characteristics responsive to a reference signal, comprising:
   a first cascaded arrangement of at least one adjustable delay circuit, wherein a first one of the at least one adjustable delay circuit is arranged to receive the reference signal, and each delay circuit has a delay interval that is adjustable responsive to an adjustment signal;
   a control circuit coupled to an output port of a last one of the at least one adjustable delay circuit and arranged to directly receive the reference signal, wherein the control circuit makes a comparison between the reference signal and a delayed reference signal from the last one of the at least one adjustable delay circuit and generates the adjustment signal responsive to the comparison; and
   a filter coupled to the control circuit and having a second cascaded arrangement of at least one adjustable delay circuit responsive to the adjustment signal, wherein a first delay circuit in the second cascaded arrangement is arranged to receive the analog input signal.

2. The filter arrangement of claim 1, wherein the control circuit compares a period of the reference signal to a period of the delayed reference signal from the last delay circuit.

3. The filter arrangement of claim 2, wherein the delay circuits in the first and second cascaded arrangements of adjustable delay circuits have equivalent delay intervals.

4. The filter arrangement of claim 3, wherein responsive to the adjustment signal a total delay interval of the first cascaded arrangement of at least one adjustable delay circuit is one period of the reference signal.

5. An integrated digital signal processing device comprising:
   a programmable logic section; and
   an analog signal processing section coupled to the programmable logic section and including:
      an adaptive anti-aliasing filter having a cut-off frequency determined by a sample clock rate, having an input port to receive an analog input signal, and having an output port; and
      an ADC coupled to the output port of the anti-aliasing filter that generates, in response to the sample clock rate, digital data for processing by the programmable logic section.

6. The device of claim 5, wherein the adaptive anti-aliasing filter is a low pass filter.

7. The device of claim 5, wherein the adaptive anti-aliasing filter is a band pass filter.

8. The device of claim 5, wherein the programmable logic section is an FPGA.

9. The device of claim 5, wherein the programmable logic section is a CPLD.

10. The device of claim 5, wherein the analog signal processing section further includes a DAC, wherein the DAC receives digital data from the programmable logic section and generates an analog output signal.

11. The device of claim 5, wherein the adaptive anti-aliasing filter comprises:
   a first cascaded arrangement of at least one adjustable delay circuit, wherein a first one of the at least one delay circuit is arranged to receive the reference signal, and each delay circuit has a delay interval that is adjustable responsive to an adjustment signal;
   a control circuit coupled to an output port of a last one of the at least one delay circuit and arranged to directly receive the reference signal, wherein the control circuit is arranged to compare the directly received reference signal to a delayed reference signal from the last delay circuit and generate the adjustment signal responsive to the comparison; and
   an anti-aliasing filter coupled to the control circuit and having a second cascaded arrangement of at least one adjustable delay circuit responsive to the adjustment signal, wherein a first delay circuit in the second cascaded arrangement is arranged to receive the analog input signal.

12. The device of claim 11, wherein the control circuit compares a period of the directly received reference signal to a period of the reference signal from the last delay circuit.

13. The device of claim 12, wherein the delay circuits in the first and second cascaded arrangements of adjustable delay circuits have equivalent delay intervals.

14. The device of claim 13, wherein responsive to the adjustment signal a total delay interval of the first cascaded arrangement of adjustable delay circuits is one period of the reference signal.

15. An integrated digital signal processing device comprising:
   a programmable logic section;
   an analog signal processing section coupled to the programmable logic section and including:
      a DAC circuit arranged to receive digital data from the programmable logic section in accordance with a sample clock rate, and from the digital input signal generate an analog signal; and
      an adaptive analog reconstruction filter having a cut-off frequency determined by the sample clock rate, and having an input port coupled to the DAC to receive the analog signal.

16. The device of claim 15, wherein the programmable logic section is an FPGA.

17. The device of claim 15, wherein the programmable logic section is a CPLD.

18. The device of claim 15, wherein the analog signal processing section further includes an ADC, wherein the ADC is arranged to convert an analog input signal to a digital output signal.

19. The device of claim 15, wherein the adaptive analog reconstruction filter comprises:
   a first cascaded arrangement of at least one adjustable delay circuit, wherein a first one of the at least one adjustable delay circuit is arranged to receive the reference signal, and each delay circuit has a delay interval that is adjustable responsive to an adjustment signal;

a control circuit coupled to an output port of a last one of the at least one delay circuit and arranged to directly receive the reference signal, wherein the control circuit is arranged to compare the directly received reference signal to the reference signal from the last delay circuit and generate the adjustment signal responsive to the comparison; and a reconstruction filter coupled to the control circuit and having a second cascaded arrangement of adjustable delay circuits responsive to the adjustment signal, wherein a first delay circuit in the second cascaded arrangement is arranged to receive the analog input signal.

20. The device of claim 19, wherein the control circuit compares a period of the directly received reference signal to a period of the reference signal from the last delay circuit.

21. The device of claim 20, wherein the delay circuits in the first and second cascaded arrangements of adjustable delay circuits have equivalent delay intervals.

22. The device of claim 21, wherein responsive to the adjustment signal a total delay interval of the first cascaded arrangement of at least one adjustable delay circuit is one period of the reference signal.

23. An ADC system adaptable to different sample rates, comprising:

a sample-rate multiplier circuit arranged to receive an input sample-rate signal, wherein the sample-rate multiplier circuit is arranged to multiply the frequency of the sample-rate signal by a predetermined value, whereby a multiplied sample-rate signal is generated;

a first selector for selecting between the input sample-rate signal and the multiplied sample-rate signal and providing as output a selected sample-rate signal;

an adaptive anti-aliasing filter coupled to the first selector and arranged to receive an input analog signal, wherein the cut-off frequency of the adaptive anti-aliasing filter is responsive to the selected sample-rate signal, and the input analog signal is filtered and provided at an output port;

a second selector having a first input port coupled to the output port of the anti-aliasing filter and a second input port arranged to receive the input analog signal, wherein the second selector is arranged to select the signal from the anti-aliasing filter when the input sample-rate signal is selected and select the input analog signal when the multiplied sample-rate is selected;

an ADC coupled to the output port of the anti-aliasing filter and arranged to receive a selected sample-rate signal and generate digital data at a rate responsive to the selected sample-rate signal;

a digital decimation filter coupled to the output port of the ADC, wherein the digital decimation filter decimates digital data from the ADC at a level responsive to the selected sample-rate signal; and a third selector coupled to the output port of the ADC and to the output port of the digital decimation filter for selecting non-decimated digital data when the input sample-rate signal is selected for the anti-aliasing filter and selecting decimated digital data when the multiplied sample-rate signal is selected.

24. The system of claim 23, wherein the adaptive anti-aliasing filter comprises:

a first cascaded arrangement of adjustable delay circuits, wherein a first one of the delay circuits is arranged to receive the reference signal, and each delay circuit has a delay interval that is adjustable responsive to an adjustment signal;

a control circuit coupled to an output port of a last one of the delay circuits and arranged to directly receive the reference signal, wherein the control circuit is arranged to compare the directly received reference signal to the reference signal from the last delay circuit and generate the adjustment signal responsive to the comparison; and an anti-aliasing filter coupled to the control circuit and having a second cascaded arrangement of adjustable delay circuits responsive to the adjustment signal, wherein a first delay circuit in the second cascaded arrangement is arranged to receive the analog input signal.

25. A DAC system adaptable to different sample rates, comprising:

a sample-rate multiplier circuit arranged to receive an input sample-rate signal, wherein the sample-rate multiplier circuit is arranged to multiply the frequency of the sample-rate signal by a predetermined value, whereby a multiplied sample-rate signal is generated;

a first selector for selecting between the input sample-rate signal and the multiplied sample-rate signal and providing as output a selected sample-rate signal;

a digital interpolation filter coupled to the first selector and having an input port arranged to receive an input digital signal, wherein the interpolation filter is arranged to interpolate values from the input digital signal responsive to the selected sample-rate signal and provide interpolated values at an output port;

a second selector having a first input port coupled to the output port of the interpolation filter and a second input port arranged to receive the input analog signal, wherein the second selector is arranged to select interpolated values from the interpolation filter when the multiplied sample-rate signal is selected and select the input digital value when the input sample-rate is selected;

a DAC coupled to the output port of the second selector and arranged to generate an analog signal on an output port responsive to the selected sample-rate signal;

an analog reconstruction filter coupled to the output port of the DAC wherein the cut-off frequency of the reconstruction filter is responsive to the selected sample-rate signal, and the input analog signal is filtered and provided at an output port; and a third selector coupled to the output port of the DAC and to the output port of the reconstruction filter for selecting a signal from the reconstruction filter when the input sample-rate signal is selected and selecting a signal from the DAC when the multiplied sample-rate signal is selected.

26. The system of claim 25, wherein the reconstruction filter comprises:

a first cascaded arrangement of adjustable delay circuits, wherein a first one of the delay circuits is arranged to receive the reference signal, and each delay circuit has a delay interval that is adjustable responsive to an adjustment signal;

a control circuit coupled to an output port of a last one of the delay circuits and arranged to directly receive the reference signal, wherein the control circuit is arranged to compare the directly received reference signal to the reference signal from the last delay circuit and generate the adjustment signal responsive to the comparison; and an anti-aliasing filter coupled to the control circuit and having a second cascaded arrangement of adjustable delay circuits responsive to the adjustment signal, wherein a first delay circuit in the second cascaded arrangement is arranged to receive the analog input signal.

27. An ADC system adaptable to different sample rates, comprising:

a sample rate multiplier circuit arranged to receive an input sample rate signal and multiply the frequency of the input sample rate signal to generate a multiplied sample rate signal;

an adaptive anti-aliasing filter having a cut-off frequency responsive to one of the sample rate signal and the multiplied sample rate signal, wherein the adaptive anti-aliasing filter provides a filtered analog signal in response to an analog input signal;

an ADC responsive to one of the input sample rate signal and the multiplied sample rate signal, wherein the ADC provides a digital signal representative of one of the analog input signal and the filtered analog signal; and a digital decimation filter having a cut-off frequency responsive to one of the sample rate signal and the multiplied sample rate signal, wherein the digital decimation filter provides a filtered digital output signal in response to the digital signal.

28. A filter comprising:

a first signal line for providing a continuous-time analog input signal;

means for deriving a continuous-time analog output signal from the continuous-time analog input signal according to a frequency response that includes a high-pass cut-off frequency;

a second signal line for providing a reference input signal, wherein the frequency response is determined by the frequency of the reference input signal.

29. The filter of claim 28 wherein a cut-off frequency of the frequency response is determined by the frequency of the frequency input signal.

30. A filter comprising:

a first signal line for providing a continuous-time analog input signal;

means for deriving a continuous-time analog output signal from the continuous-time analog input signal according to a frequency response that includes cut-off frequencies for a band pass filter; and a second signal line for providing a reference input signal, wherein the frequency response is determined by the frequency of the reference input signal.

* * * * *